United States Patent
Lee

(10) Patent No.: US 9,626,898 B2
(45) Date of Patent: Apr. 18, 2017

(54) FLAT PANEL DISPLAY

(71) Applicant: Samsung Display Co., Ltd., Yongin, Gyeonggi-Do (KR)

(72) Inventor: Sang Shin Lee, Hwaseong-si (KR)

(73) Assignee: Samsung Display Co., Ltd., Gyeonggi-Do (KR)

( * ) Notice: Subject to any disclaimer, the term of this patent is extended or adjusted under 35 U.S.C. 154(b) by 0 days.

(21) Appl. No.: 14/497,101

(22) Filed: Sep. 25, 2014

(65) Prior Publication Data

US 2015/0091785 A1    Apr. 2, 2015

(30) Foreign Application Priority Data

Oct. 2, 2013 (KR) .......... 10-2013-0117932

(51) Int. Cl.
G09G 3/3208 (2016.01)

(52) U.S. Cl.
CPC ... G09G 3/3208 (2013.01); *G09G 2300/0452* (2013.01)

(58) Field of Classification Search
CPC .............. G09G 3/3208; G09G 3/3225; G09G 2300/0452; G09G 2320/0242
USPC .................................. 345/76–107
See application file for complete search history.

(56) References Cited

U.S. PATENT DOCUMENTS

| | | | |
|---|---|---|---|
| 5,113,274 A | 5/1992 | Takahashi et al. | |
| 5,311,337 A | 5/1994 | McCartney, Jr. | |
| 7,397,455 B2 * | 7/2008 | Elliott | G02F 1/1368 345/88 |
| 7,821,553 B2 | 10/2010 | Ellis-Monaghan et al. | |
| 7,855,740 B2 | 12/2010 | Hamilton, Jr. et al. | |
| 8,130,293 B2 | 3/2012 | Kanamori et al. | |
| 8,289,428 B2 | 10/2012 | Boemler | |
| 2005/0207676 A1 | 9/2005 | Lin et al. | |
| 2007/0034884 A1 | 2/2007 | McKee | |
| 2008/0001525 A1 * | 1/2008 | Chao | H01L 27/3211 313/500 |
| 2011/0025723 A1 * | 2/2011 | Kim | H01L 27/3218 345/690 |
| 2011/0043500 A1 * | 2/2011 | Kwak | G09G 3/006 345/206 |
| 2015/0015466 A1 * | 1/2015 | Feng | G09G 3/2003 345/77 |

FOREIGN PATENT DOCUMENTS

KR    10-0579048 B1    5/2006

OTHER PUBLICATIONS

Machine translation of KR 10-2005-0090101.*

* cited by examiner

*Primary Examiner* — Michael Pervan
(74) *Attorney, Agent, or Firm* — Knobbe, Martens, Olson & Bear, LLP

(57) ABSTRACT

A flat panel display is disclosed. In one aspect, the flat panel display includes a plurality of pixels arranged in rows and columns. The pixels include red, green, and blue pixels. The green pixels are formed to be spaced apart in the row and column directions such that at least two neighboring green pixels are indistinguishable at a predetermined viewing distance.

22 Claims, 7 Drawing Sheets

FLAT PANEL DISPLAY

CROSS-REFERENCE TO RELATED APPLICATIONS

This application claims priority to and the benefit of Korean Patent Application No. 10-2013-0117932 filed in the Korean Intellectual Property Office on Oct. 2, 2013, the entire contents of which are incorporated herein by reference.

BACKGROUND

Field

The described technology generally relates to a flat panel display device.

Description of the Related Technology

Examples of flat panel display devices include liquid crystal displays (LCDs), organic light-emitting diode (OLED) displays electrophoretic displays, plasma displays, electrowetting displays, MEMS displays, and the like.

OLED displays have recently attracted attention due to their favorable characteristics related to self-emission. Due to their self-emissive properties, OLED displays do not require a separate light source in contrast to LCDs, and as a result, it is possible to reduce the thickness and weight thereof. Additional characteristics of OLED displays include low power consumption, high luminance, and fast response speeds.

SUMMARY OF CERTAIN INVENTIVE ASPECTS

One inventive aspect is a flat panel display device having the advantages of having high resolution by forming the same colored pixels adjacent in a row direction and a column direction at intervals that are not distinguishable by a user at an appropriate distance.

Another aspect is a flat panel display device including a plurality of pixels arranged in a row direction and a column direction, in which the pixels is any one of red pixels, green pixels, and blue pixels, and the adjacent green pixels in the row direction and the column direction are formed at a distance that a user does not distinguish the adjacent green pixels from an appropriate distance The distance between the adjacent green pixels in the row direction and the column direction may be 100 μm or less.

The red pixel, the green pixel, and the blue pixel may have pixels per inch of 500 or more.

The appropriate distance may be about 20 cm or more and about 25 cm or less.

The green pixels may be arranged in a diamond structure.

The red pixels or the blue pixels may be positioned at the center of the diamond structure.

The blue pixels may be included in a row or a column in which the red pixels are included and the red pixels may not be included in the row or the column in which the blue pixels are included.

A central point of the blue pixel or the red pixel may be positioned at a point at which a horizontal line and a vertical line meet each other after drawing the horizontal line passing through a central point of one green pixel and the vertical line passing through the central point of the other green pixel positioned in an oblique direction.

The flat panel display device may be an organic light-emitting diode (OLED) display.

The red pixel, the green pixel and the blue pixel may include a red organic emission layer, a green organic emission layer, and a blue organic emission layer, respectively, and the red organic emission layer, the green organic emission layer, and the blue organic emission layer may be exposed outside by an opening formed in a pixel defining layer.

Shapes of the pixels are determined by the opening, and the green pixel may have an octagon, a circle, or an oval, or a polygonal structure of octagon or more similar to the circle or the oval.

The red pixel and the blue pixel may have quadrangle structures or structures with rounded edges of the quadrangle structure.

The area of the green pixel may be 30% or more and 70% or less of an area of the red pixel.

The distance between the red pixels in the column direction and the row direction may be larger than or equal to the distance between the blue pixels in the column direction and the row direction.

The distance between the green pixel and the pixel having a different color adjacent in the row direction may be smaller than or equal to a distance between the green pixel and the pixel having a different color adjacent in the column direction.

The green pixels may be arranged so that a longitudinal direction is changed according to a position.

The longitudinal direction of the green pixels may be arranged to indicate the red pixels.

The blue pixels or the red pixels adjacent in the row direction and the column direction may be formed at a distance that a user does not distinguish the adjacent blue pixels or the adjacent red pixels at an appropriate distance.

The distance between the blue pixels or the red pixels adjacent in the row direction and the column direction may be about 100 μm or less.

Another aspect is a flat panel display, comprising: a plurality of pixels arranged in rows and columns, wherein the pixels comprise red, green, and blue pixels, and wherein the green pixels are formed to be spaced apart in the row and column directions such that at least two neighboring green pixels are indistinguishable at a predetermined viewing distance.

In the above display, the distance between the green pixels in the row and column directions is about 100 μm or less. In the above display, the predetermined viewing distance is between about 20 cm to about 25 cm. In the above display, the green pixels are arranged in a substantially diamond shape. In the above display, at least one of the red or blue pixels is positioned at the center of each of the diamond shapes. In the above display, each row of pixels and each column of pixels include only red or blue pixels. In the above display, the flat panel display is an organic light-emitting diode (OLED) display.

The above display further comprises a pixel defining layer having a plurality of openings defined therein, wherein each of the red, green, and blue pixels respectively includes red, green, and blue organic emission layers formed in the openings. In the above display, the pixels have substantially the same shapes as the openings and wherein each of the green pixels has the shape of an octagon, a circle, an oval, or a polygon having four or more sides. In the above display, the red and blue pixels have quadrangular shapes or quadrangular shapes including rounded corners. In the above display, each of the green pixels has an area that is sized between about 30% to about 70% of the area of each of the red pixel.

In the above display, the distance between the red pixels in each of the column and row directions is greater than or substantially equal to the distance between the blue pixels in the column and row directions. In the above display, the distance between a green pixel and a first non-green pixel adjacent in the row direction is less than or substantially equal to the distance between the green pixel and a second non-green pixel adjacent in the column direction.

In the above display, the green pixels have a length and a width and wherein the length of the green pixels extends in either the row or column direction based on the position of the green pixels. In the above display, the length of the green pixels extends towards the red pixels. In the above display, each of the blue and red pixels is formed to be spaced apart in the row and column directions such that i) at least two adjacent blue pixels are indistinguishable at the predetermined viewing distance and ii) at least two adjacent red pixels are indistinguishable at the predetermined viewing distance. In the above display, the distance between each of the blue and red pixels in the row and column directions is about 100 μm or less.

Another aspect is a flat panel display, comprising: a plurality of pixels including red, green, and blue pixels arranged in rows and columns, wherein the red pixels have a first size, the green pixels have a second size and the blue pixels have a third size, and wherein the second size is less than each of the first and third sizes.

In the above display, diagonally arranged red pixels are spaced apart at a first distance, wherein diagonally arranged green pixels are spaced apart at a second distance, wherein diagonally arranged blue pixels are spaced apart at a third distance, and wherein the second distance is less than each of the first and third distances. In the above display, the green pixels are spaced apart in the row and column directions such that at least two adjacent green pixels are indistinguishable from each other at a predetermined viewing distance. In the above display, the red pixels are arranged in a substantially square shape, wherein the blue pixels are arranged in a substantially square shape, and wherein the green pixels are arranged in a substantially diamond shape.

According to at least one embodiment, since a user cannot distinguish pixels having the same color adjacent in a row direction and a column direction from an appropriate viewing distance, it is possible to provide a flat panel display device so that the perceived resolution is two times that of the actual resolution. The perceived resolution of the flat panel display device may be maximized so that the user cannot distinguish green pixels adjacent in row and column directions based on the green pixels which are more easily distinguished by the user.

BRIEF DESCRIPTION OF THE DRAWINGS

FIG. 2 is a diagram illustrating the position of each pixel for each color in a flat panel display according to an exemplary embodiment.

DETAILED DESCRIPTION OF CERTAIN INVENTIVE EMBODIMENTS

Figure 1:
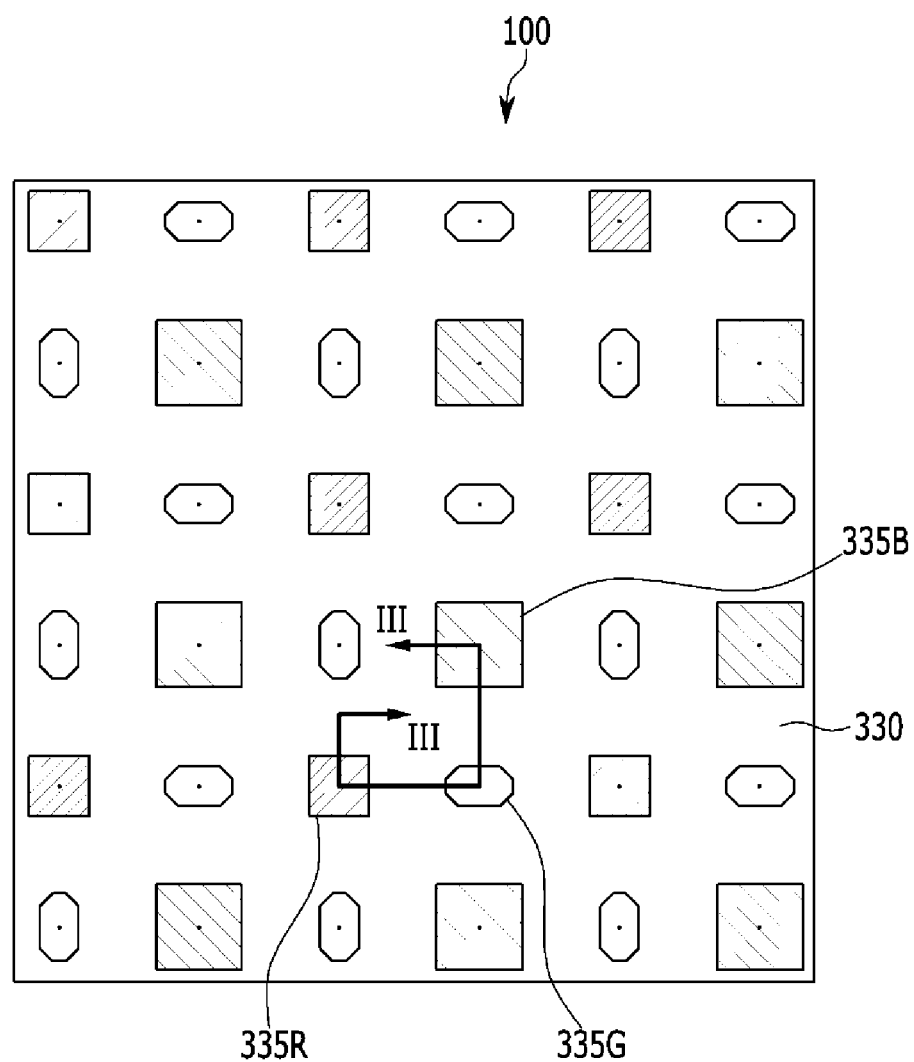
FIG. 1 is a pixel layout view in a partial area of an OLED display according to an exemplary embodiment.

In order to display a high-quality image, display devices require high resolution. Generally, the more pixels for a given area, the greater the resolution. In OLED displays, a pixel defining layer (PDL) is formed between the pixels with openings in the PDL to define pixel areas. However, a display area needs to have a minimum size in order to form the PDL with openings. Consequently, it is difficult to provide a high resolution in displays having a limited size. Particularly in a small display, it becomes difficult to realize the high resolution that is the same as that of a larger flat panel display since each pixel has a minimum size and images are sized for certain predefined dimensions. Thus, there is a limitation to increase the resolution of smaller displays.

The described technology will be described more fully hereinafter with reference to the accompanying drawings, in which exemplary embodiments of the described technology are shown. As those skilled in the art would realize, the described embodiments may be modified in various different ways, all without departing from the spirit or scope of the described technology.

In the drawings, the thicknesses of layers, films, panels, regions, etc., may be exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

The described technology relates to a flat panel display device and may be applied to various types of flat panel display devices. Hereinafter, an OLED display will be mainly described as an example of a flat panel display. The effects of the described technology with respect to arrangement of pixels may also be applied to other flat panel display devices.

Hereinafter, an OLED display according to an exemplary embodiment will be described in detail with reference to FIG. 1.

FIG. 1 is a pixel layout view of a partial area of an OLED display according to an exemplary embodiment.

FIG. 1 illustrates pixels formed in a partial area of the OLED display. In FIG. 1, the OLED display includes a red R pixel, a blue B pixel, and a green G pixel, and each pixel is positioned in an opening defined by the pixel defining layers (PDLs) 330.

The red pixel R is located in an opening 335R of the pixel defining layer 330, the blue pixel B is located in another opening 335B, and the green pixel G is located in yet another opening 335G. An organic emission layer is exposed in each of the openings illustrated in FIG. 1 so that light emitted from the organic emission layer can be emitted in an upward direction.

According to FIG. 1, the blue pixel B is largest, and the green pixel G is smallest. The size of the red pixel R is between that of the blue and green pixels B and G.

Further, in the configuration illustrated in FIG. 1, the blue and red pixels B and R have square shapes and the green pixel G has an octagonal structure. According to some embodiments, the blue and red pixels B and R are formed to have rounded corners. Further, according to some embodiments, the green pixel G has a circular or oval shape instead of the octagonal shape or has the shape of a polygon with 8 or more sides similar to the circle or the oval.

The red and green pixels R and G are alternately arranged in the first row illustrated in FIG. 1. In addition, the green and blue pixels G and B are alternately arranged in the second row below the first row. These two rows of the structure are continuously arranged such that the green pixels G are not vertically adjacent to each other. As a result, the green pixels G are arranged in a diamond structure. That is, the centers of the green pixels G can be connected to each other to form a diamond structure. The adjacent green pixels G are formed in an oblique direction. Thus, adjacent green pixels G in a row or column direction have the red or blue pixels R or B formed therebetween.

The distances between adjacent green pixels G in the row or column directions are selected such that a user cannot distinguish two green pixels G when viewed from an appropriate distance or predetermined viewing distance. The appropriate distance may be determined according to the appropriate usage of an electronic device including the OLED display. As a result, the distances in the row and column directions between the adjacent green pixels G may be changed. For example, the appropriate distance can be relatively short when the device is a portable mobile device and relatively long when the device is a large device. Based on the appropriate distance, the distances between the adjacent green pixels G can be changed.

According to the embodiment of FIG. 1, the distance between the adjacent green pixels G in the row and column directions is about 100 μm or less. Due to the configuration in which the green pixels G arranged in the diamond structure, the adjacent green pixels G are not distinguishable, and as a result, the perceived resolution is twice that of the actual resolution. This will be described in detail below in connection with the perceived resolution described below with reference to FIGS. 5 and 6.

The first row includes the red pixels R but the blue pixels B. Similarly, the second row includes the blue pixels B but the red pixels R. As such, the red pixels R or the blue pixels B are respectively formed only in odd rows or even rows. In contrast, the green pixels G are formed in each row. Thus, only one of the red and blue pixels R and B are formed in each of the odd and even rows and the green pixels G are formed in each row.

The adjacent red pixels R in the row and column directions form a quadrangular structure. The blue pixels B are formed at the center of the quadrangular structure and the green pixels G are formed at respective edges of the quadrangular structure. The adjacent red pixels R may be formed at distances so that a user cannot distinguish two red pixels R from an appropriate distance. The distances between the adjacent red pixels R in each of the row and column directions are about 100 μm or less.

The adjacent blue pixels B also have a quadrangular structure. The red pixels R are formed at the center of the quadrangular structure and the green pixels G are formed at respective edges of the quadrangular structure. The adjacent blue pixels B may be formed at distances so that a user cannot distinguish two blue pixels B from an appropriate distance. The distances between the adjacent blue pixels B in each of the row and column directions are about 100 μm or less.

According to the embodiment shown in FIG. 1, the green pixels G are formed with a length and a width which vary according to the position of the pixels. In this configuration, the longitudinal direction of the green pixel G is in the same direction as the red pixels R, and as a result, the distances between the green pixels G and other pixels are regular.

In the embodiment shown in FIG. 1, the central point of each of the blue and red pixels B and R fall on intersections formed between horizontal and vertical lines passing through the central points of green pixels G adjacent in the oblique direction.

In the embodiment shown in FIG. 1, the red and blue pixels R and B have square structures and the green pixels G have an octagonal structure. However, according to other embodiments, each pixel has a polygonal shape with three or more sides.

In the embodiment shown in FIG. 1, the number of pixels per inch (ppi) including red, green, and blue pixels varies according to an appropriate viewing distance so that the perceived resolution is two times that of the actual resolution.

According to an experiment, when the appropriate distance is about 20 cm for the structure as shown in FIG. 1, the green pixels G in the row and column directions are not distinguishable but are perceived to have a ppi of about 620 or greater. Thus, the perceived resolution becomes two times the actual resolution. The blue and red pixels B and R are also spaced apart such that they cannot be distinguished, however, since green pixels are more easily distinguished, the green pixels will be mainly described below.

Further, when the appropriate distance is about 25 cm for the structure as shown in FIG. 1, the adjacent green pixels G in the row and column directions are not distinguishable, but are perceived to have a ppi of about 500 or more. Thus, the perceived resolution becomes two times the actual resolution. The blue and red pixels B and R are also spaced apart to be indistinguishable.

Mobile devices can have an appropriate viewing distance between about 20 cm to about 25 cm. The green pixels G may be spaced apart at a greater distance as the appropriate viewing distance increases. In the embodiment of FIG. 1, when the pixels are spaced apart to have a ppi of 500 or greater, the perceived resolution becomes two times the actual resolution. That is, when the pixels are arranged to have a ppi of 500 ppi or less, it is difficult to improve the perceived resolution.

In the OLED display of FIG. 1, the size and structure of the openings in the pixel defining layers 330 are mainly illustrated.

The position of each pixel for each color will be described with reference to FIG. 2 for a flat panel display according to an exemplary embodiment.

FIG. 2 is a diagram schematically illustrating the position of each pixel for each color in a flat panel display according to an exemplary embodiment.

In FIG. 1, the arrangement and the structure of the pixels are described based on the configuration of an OLED display. However, since the described technology may be applied to various types of flat panel displays, the position of each colored pixel will be briefly described with referenced to FIG. 2.

In FIG. 2, R, G, and B respectively represent red, green, and blue pixels.

As illustrated in FIG. 2, the flat panel display device includes a plurality of pixels arranged in row and column directions so as to form a matrix.

First, the green pixels G are included in each row and in each column. The green pixels G are formed so as to not be vertically or horizontally directly adjacent to each other. Thus, the red or blue pixels R or B are positioned between the adjacent green pixels G. As a result, the green pixels G are arranged in a diamond structure. The red and blue pixels R and B are positioned at the center of the diamond structure formed by the green pixels G.

Each row or column only includes of the red or blue pixels R or B. That is, the blue pixels B are not formed in the row or the column in which the red pixels R are included, and similarly, the red pixels R are not forming in the row or the column in which the blue pixels B are included. As a result, each row or column includes the red and green pixels R and G, or includes the blue and green pixels B and G.

In the embodiment shown in FIG. 1, the central point of each of the blue and red pixels B and R fall on intersections formed between horizontal and vertical lines passing through the central points of green pixels G adjacent in the oblique direction.

The sizes of the green, red, and blue pixels G, R, and B may be the same as each other or may be different from each other as in FIG. 1. Further, the shapes of the green, red, and blue pixels G, R, and B may be polygonal shapes having three of more sides.

In the pixel arrangement illustrated in FIG. 2, the distance between pixels having the same color and adjacent to each other in either the row or column direction is about 100 μm or less. Further, two pixels having the same color and adjacent to each other in the row or column direction are formed at a distance so as to not be distinguishable by a user from the appropriate distance, and thus, the perceived resolution becomes two times better than actual resolution.

The pixels per inch (ppi) including the green, red, and blue pixels G, R, and B is about 500 or greater.

The cross sectional structure of the OLED display shown in FIG. 1 will be briefly described with reference to FIG. 3.

Figure 3:
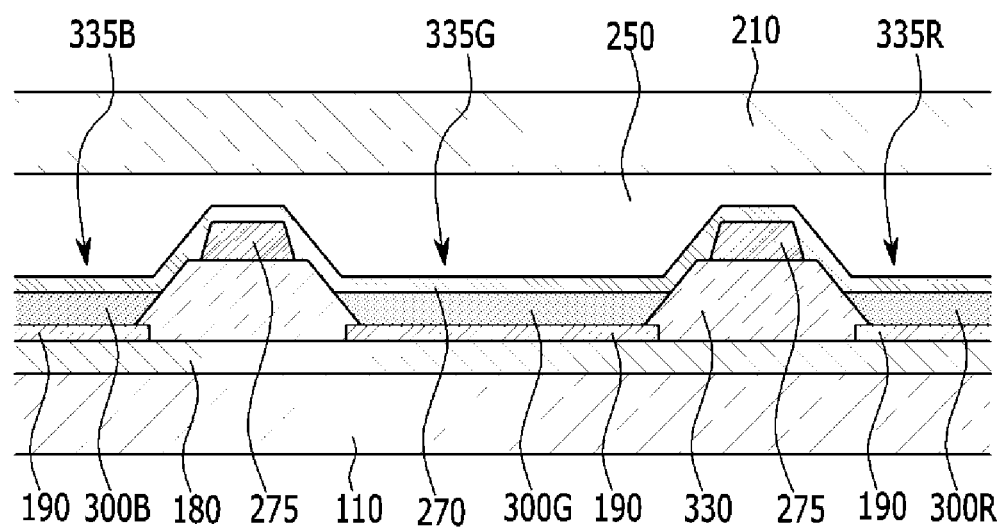
FIG. 3 is a cross-sectional view taken along line III-III of FIG. 1.

FIG. 3 is a cross-sectional view taken along line III-III of FIG. 1.

Referring to FIGS. 1 and 3, the OLED display includes a first electrode 190 formed on a first substrate 110, an organic emission layer 300, a second electrode 270, a pixel defining layer 330 including an opening 335, a capping layer 250, and a second substrate 210.

The first substrate 110 is of an electrically insulating substrate formed of glass, quartz, ceramics, metal, plastic, or the like. Further, when the first substrate 110 is formed of plastic, the OLED display may have a flexible characteristic and a stretchable or rollable characteristic.

Although not illustrated on the first substrate 110, a plurality of wirings, a switching element, and a driving transistor may be included. In more detail, the first substrate 110 may include constituent elements such as the plurality of wires including one or more scan lines, data lines, driving power lines, common power lines, and the like, two or more thin film transistors connected to the wires corresponding to one pixel, and one or more capacitors, and the like. The constituent elements may be formed to have various structures according to the design requirements of the embodiment.

The constituent elements are covered by a passivation layer 180.

The first electrode 190 is positioned on the passivation layer 180 and receives a current from a constituent element (a driving thin film transistor) below the passivation layer 180 through a contact hole (not illustrated) formed in the passivation layer 180.

The first electrode 190 may have various polygonal shapes and at least a partial region of the first electrode 190 is exposed by the opening 335 in the pixel defining layer 330.

The pixel defining layer 330 covers a portion of the first electrode 190 and the remaining portion is exposed by the opening 335. The pixel defining layer 330 may cover an edge of the first electrode 190.

Referring to FIG. 1, the pixel defining layer 330 forms openings having different shapes and sizes for each color pixel. That is, the opening 335G of the green pixel G has an octagonal structure and the openings 335R and 335B of the red and blue pixels R and B have the square structures. In the embodiment of FIG. 1 the openings 335R and 335B of the red and blue pixels R and B have the same shape, but the opening 335B of the blue pixel B is larger.

The organic emission layer 300 is formed in the opening 335 of the pixel defining layer 330. The color of the pixel is defined according to the color of light emitted from the organic emission layer 300 when receiving a current. The red, green, and blue pixels R, G, and B respectively include red, green and blue organic emission layers 300R, 300G, and 300B.

Each organic emission layer 300 is formed in the same shape as the shape of the opening 335.

In the exemplary embodiment of FIG. 3, a spacer 275 is formed on the pixel defining layer 330. The spacer 275 functions to substantially uniformly maintain a distance from the second upper substrate 210 and may be omitted based on the design requirement of the embodiment.

A second electrode 270 is formed so as to cover the pixel defining layer 330, the spacer 275, and the organic emission layer 300.

The second electrode 270 is formed on the entire surface and may be a cathode serving as an electron injection electrode or an anode. The second electrode 270 may be made of a transparent conductive material which can transmit light or a metal material which can reflect light.

In the configuration of FIG. 3, the second electrode 270 is formed on the spacer 275, however, according to other embodiments, the second electrode 270 is formed between the pixel defining layer 330 and the spacer 275.

The capping layer 250 is formed on the entire second electrode 270. The capping layer 250 is a layer which functions to protect the organic emission layer 300 from the external environment which may include moisture or the like.

The second substrate 210 is formed on the capping layer 250. The second substrate 210 is an electrically insulating substrate formed of glass, quartz, ceramics, metal, plastic, or the like. Further, in the configuration where the second substrate 210 is formed of plastic or the like and the first substrate 110 is formed of the same material, the OLED display may have a flexible characteristic and a stretchable or rollable characteristic.

Hereinafter, layout of the pixels having different colors formed in the OLED display will be described in more detail with reference to FIG. 4.

Figure 4:
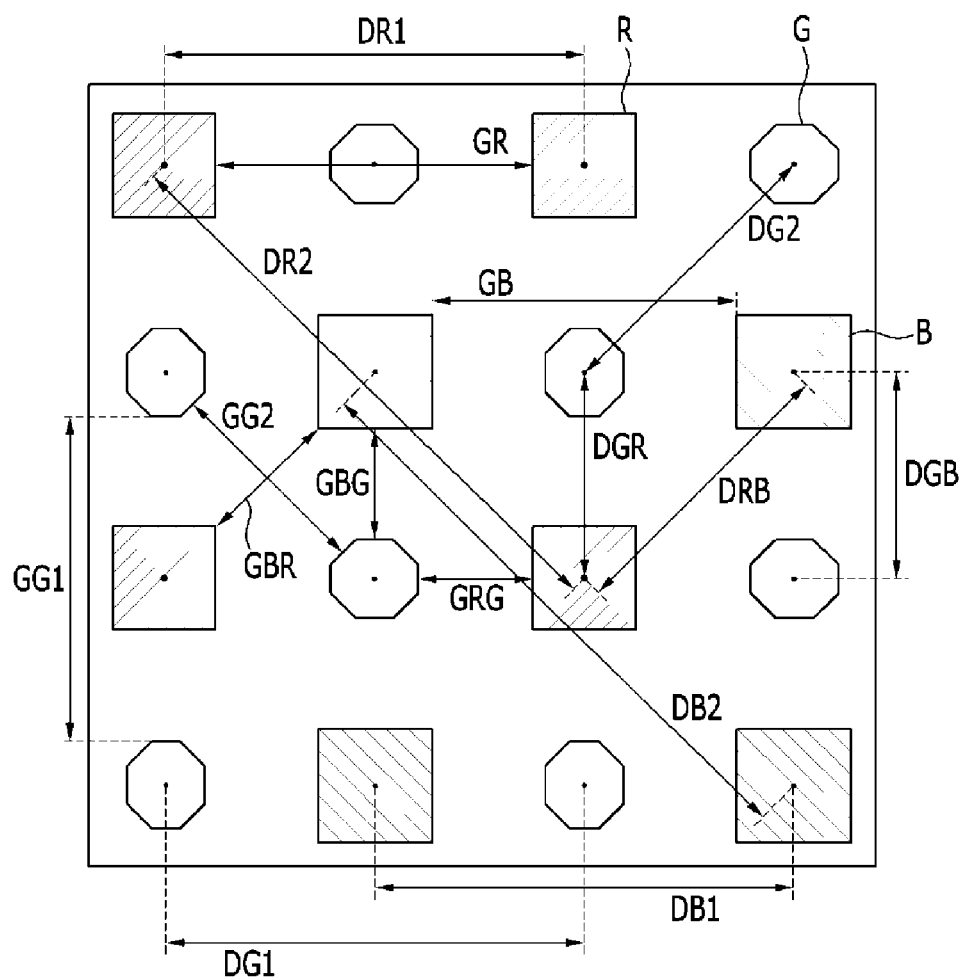
FIG. 4 is a diagram illustrating the distances between pixels in the OLED display according to an exemplary embodiment.

FIG. 4 is a diagram illustrating the distances between pixels in the OLED display according to an exemplary embodiment.

Pixels illustrated in FIG. 4 are similar to the pixels shown in FIG. 1, however, the size of each of the green pixels G is increased in FIG. 4. The described technology may be applied as an exemplary embodiment in which the size or shape of either of the red or blue pixels R or B is changed in addition to the green pixel G.

Since the pixel arrangement of FIG. 4 was described in connection with FIG. 1, hereinafter, the distances between pixels will be mainly described.

Hereinafter, a distance refers to the distance between the pixels, i.e., the distance between the centers of the pixels.

First, the red pixel R will be described. The distance between red pixels R adjacent to each other in a row direction is DR1, and although not illustrated, the distance between red pixels R adjacent to each other in a column direction is also DR1. DR1 has a value of the length of one side of the red pixel R plus about 100 μm or less. This is because the distance between edges of the red pixels R is about 100 μm or less.

Further, in FIG. 4, the distance between the red pixels R adjacent to each other in an oblique direction is illustrated as DR2. Since a quadrangle formed by four red pixels R adjacent to each other row and column directions forms a square structure, the squared value of the distance DR2 is twice the squares value of DR1.

Meanwhile, the red pixel R has a DGR value referring to the distance from the adjacent green pixel G and also has a DRB value referring to the distance from the adjacent blue pixel B. Since the centers of four adjacent pixels are connected to each other to form a square, the squared value of DRB is twice the squared value of DGR.

A blue pixel B will now be described. First, the distance between blue pixels B adjacent to each other in a row direction is DB1, and although not illustrated, the distance between blue pixels B adjacent to each other in a column direction is also DB1. DB1 has a value of the length of one side of the blue pixel B plus about 100 μm or less. This is because the distance between edges of the blue pixels B is about 100 μm or less. Here, DB1 and DR1 may have the same value as each other.

Further, in FIG. 4, the distance between the blue pixels B adjacent to each other in an oblique direction is illustrated as DB2. Since a quadrangle formed by four blue pixels B adjacent to each other in row and column directions has a square structure, the squares value of the distance DB2 is twice the squared value of DB1. DB2 may be the same as DR2. The distance between a blue pixel B and the adjacent green pixel G is DGB. DGB may be the same as DGR.

The green pixel G will now be described. The distance between adjacent green pixels G in an oblique direction is DG2 and the distance between adjacent green pixels G in a column or row direction is DG1. DG2 may have the same value as DB2 and DR2 and DG1 may have the same value as DB1 and DR1.

The relationships between the above distances is due to the center of each pixel being positioned at a regular distance in column and row directions. However, according to some embodiments, the centers of four adjacent pixels are connected to each other to form a rectangle.

Hereinabove, the distance relationships between the pixels will be described.

In FIG. 4, the distance between the edges of adjacent red pixels R in a row or column direction is illustrated as GR, the distance between the edges of adjacent blue pixels B in a row or column direction is illustrated as GB, and the distance between the edges of adjacent green pixels G in a row or column direction is illustrated as GG1.

Further, the distance between the edges of adjacent green pixels G in an oblique direction is illustrated as GG2, the distance between the edges of a green pixel G and an adjacent red pixel R is illustrated as GRG, the distance between the edges of a green pixel and an adjacent blue pixel B is illustrated as GBG, and the distance between the edges of a red pixel R and a blue pixel B adjacent in an oblique direction is illustrated as GBR.

Here, GB, GG1, and GR which are distances in the row direction and the column direction and the distances between the same colors have all values of about 100 μm or less. Further, the distances are formed such that a user may not be able to distinguish two adjacent pixels at an appropriate distance.

Further, the distance GR between the red pixels R may be smaller than or equal to the distance GB between the blue pixels B.

The distance between the green pixel G and the blue or red pixel B or R adjacent in the column or row direction may be determined according to the size of the blue or red pixel B or R. In the illustrated embodiment, since the blue pixel B is larger than the red pixel R, the distance from the green pixel G to the blue pixel B is less than from the green pixel G to the red pixel R.

In the exemplary embodiment of FIG. 4, the green pixel G has a regular octagonal structure. However, in the embodiment of FIG. 1, the green pixel G is formed to have a longitudinal direction which is varied based on the position of the green pixel G. In the embodiment of FIG. 1, the longitudinal direction of the green pixel G is aligned with the red pixels R, and as a result, the distance between the green pixels G and adjacent pixels is regular.

In the exemplary embodiment of FIG. 4, the distances between the green pixels G and adjacent pixels in the row direction may be less than or equal to the distance between the green pixel G and adjacent pixels in the column direction. Further, the green pixel G may have a polygonal structure having four or more side and having different sides with different lengths in the row and column directions.

The area of the green pixel G may be between about 30% and about 70% of the area of the red pixel R.

As such, the ppi for each color pixel is about 500 or more.

As described above, two adjacent green pixels G are formed to be spaced apart in the column and row directions such that they are not distinguishable by the user at the appropriate viewing distance. The perceived resolution of the green pixels will be described in FIGS. 5 and 6.

Figure 5:
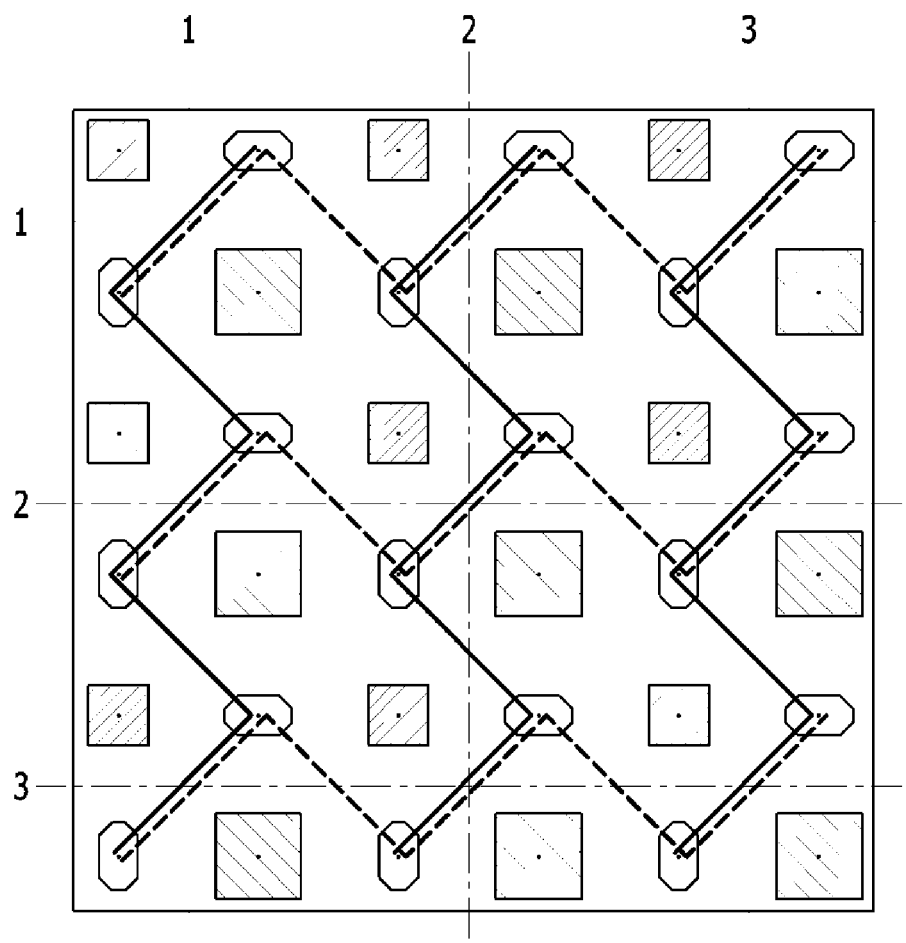
FIGS. 5 and 6 illustrate green lines recognized according to resolution in the organic light emitting diode display according to the exemplary embodiment of the present invention.
Figure 6:
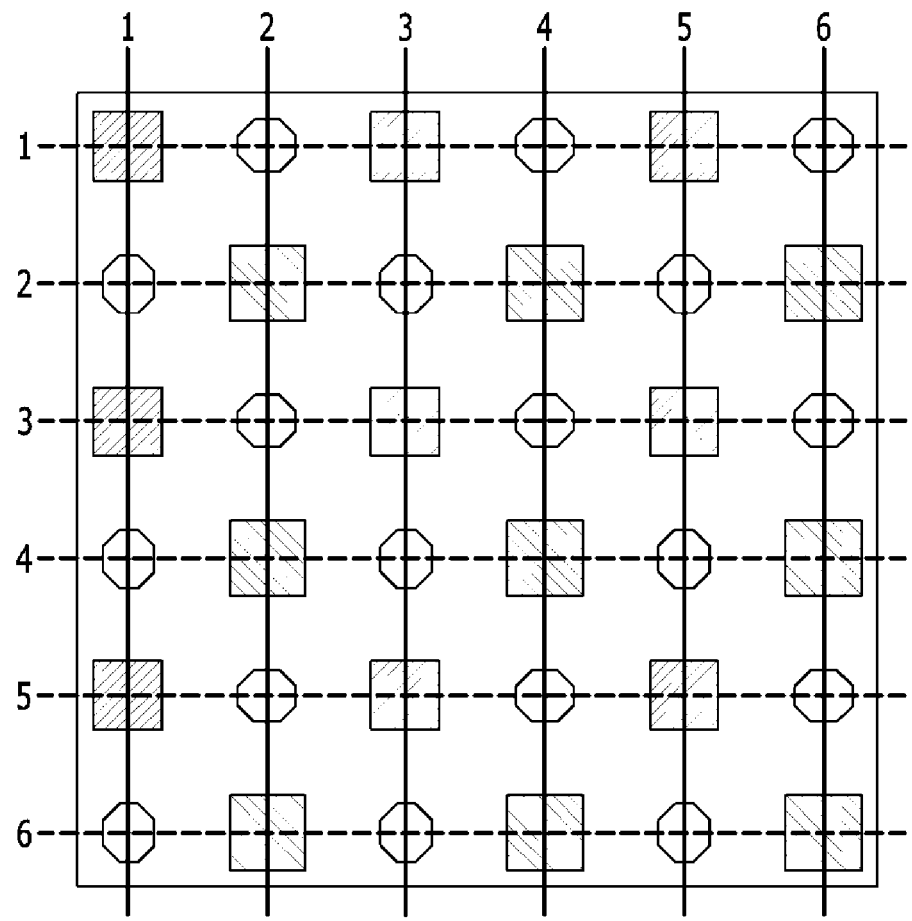

FIGS. 5 and 6 illustrate green lines perceived according to resolution in the OLED display according to an exemplary embodiment. In FIGS. 5 and 6, only the green pixels G are turned on to emit light to illustrate the perception of these pixels by a user.

In the case where the distance between adjacent green pixels G in the row direction and the column direction is large enough to be recognized by the user, the distances are recognized by the user as shown in FIG. 5. That is, when only the green pixel is turned on, it is recognized that a finely curved green line is formed, and as a result, in shown in FIG. 5, three horizontal lines and three vertical lines can be recognized.

However, in the case where the distance between the adjacent green pixels G in the row direction and the column direction is selected so as not to be recognized by the user, as shown in FIG. 6, green pixels G which are sparsely formed are recognized as connected to each other. As a result, a total of six horizontal lines and six vertical lines are recognized. As a result, since two times as many lines are recognized than in FIG. 5, the perceived resolution becomes two times that of the actual resolution.

As a result, even though fewer than two times as many pixels are formed, the recognition resolution may become two times that of the actual resolution.

As such, the distance for determining whether or not adjacent pixels having the same color are distinguishable varies according to the color of the pixels.

This will be described with reference to FIG. 7.

Figure 7:
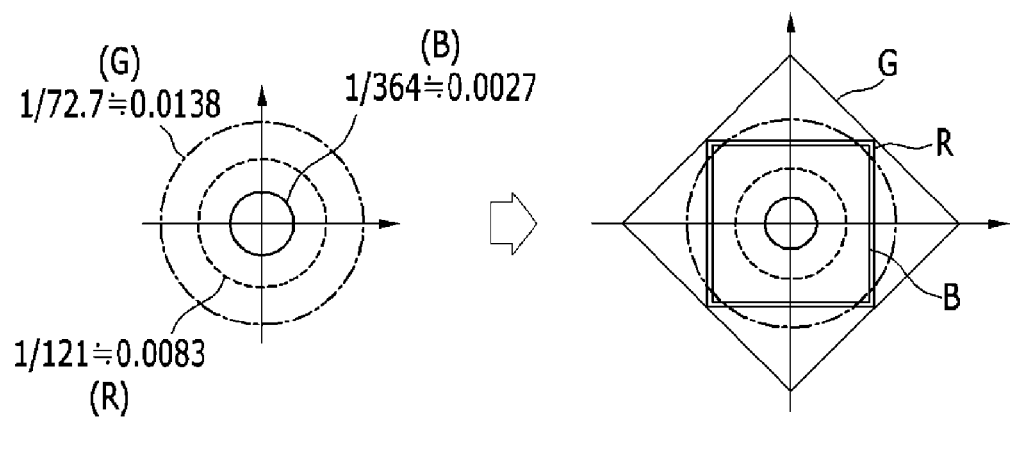
FIG. 7 is a diagram comparing a recognition spatial frequency and a pixel distance of the organic light emitting diode display according to the exemplary embodiment of the present invention.

FIG. 7 is a diagram comparing a recognition spatial frequency and the distance between pixels of the OLED display according to an exemplary embodiment.

FIG. 7 includes two drawings. The left drawing is a reference illustration showing the ease of distinguishing two adjacent pixels based on the spatial frequency of the color of the pixels to be distinguished. The frequencies of the colors are graphed on a coordinate system to be compared to each other.

As shown in the left drawing of FIG. 7, green encompasses the largest area, and is thus, the most easily distinguished color. Red and blue are consecutively more difficult to distinguish. Therefore, in a configuration where it is difficult to distinguish adjacent green pixels in the row and column directions, there is high possibility that other color pixels are also not distinguishable.

The right drawing of FIG. 7 superimposes the distances in the column and row directions according to the embodiment of FIG. 1 over the left drawing of FIG. 7. According to the right drawing of FIG. 7, since the spatial frequency of each color is in a position which is not recognizable by the user, the flat panel display according to the embodiment of FIG. 1 may have a perceived resolution twice that of the actual resolution.

While the described technology has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A flat panel display, comprising:
a plurality of pixels arranged in rows and columns,
wherein the pixels comprise red, green, and blue pixels, and
wherein the green pixels are formed to be spaced apart in the row and column directions such that at least two neighboring green pixels are indistinguishable at a predetermined viewing distance, wherein four adjacent green pixels are arranged in a substantially diamond shape having one of the red and blue pixels positioned at the center of each diamond shape, wherein the diamond shape does not intersect with a red pixel and a blue pixel, wherein the green pixels have a length greater than a width, and wherein the length of a first green pixel extends in a row direction toward a first red pixel disposed in a row direction from the first green pixel and the length of a second green pixel extends in a column direction toward a second red pixel disposed in a column direction from the second green pixel.

2. The flat panel display of claim 1, wherein the distance between neighboring green pixels in the row and column directions is about 100 µm or less.

3. The flat panel display of claim 2, wherein the predetermined viewing distance is between about 20 cm to about 25 cm.

4. The flat panel display of claim 2, wherein the flat panel display is an organic light-emitting diode (OLED) display.

5. The flat panel display of claim 4, further comprising a pixel defining layer having a plurality of openings defined therein, wherein each of the red, green, and blue pixels respectively includes red, green, and blue organic emission layers formed in the openings.

6. The flat panel display device of claim 5, wherein the pixels have substantially the same shapes as the openings and wherein each of the green pixels has the shape of an octagon, a circle, an oval, or a polygon having four or more sides.

7. The flat panel display device of claim 6, wherein the red and blue pixels have quadrangular shapes or quadrangular shapes including rounded corners.

8. The flat panel display device of claim 7, wherein each of the green pixels has an area that is sized between about 30% to about 70% of the area of each of the red pixel.

9. The flat panel display device of claim 7, wherein the distance between the red pixels in each of the column and row directions is greater than or substantially equal to the distance between the blue pixels in the column and row directions.

10. The flat panel display device of claim 7, wherein the distance between a green pixel and a first non-green pixel adjacent in the row direction is less than or substantially equal to the distance between the green pixel and a second non-green pixel adjacent in the column direction.

11. The flat panel display device of claim 7, wherein length of the green pixels extends in either the row or column direction based on the position of the green pixels.

12. The flat panel display device of claim 2, wherein each of the blue and red pixels is formed to be spaced apart in the row and column directions such that i) at least two adjacent blue pixels are indistinguishable at the predetermined viewing distance and ii) at least two adjacent red pixels are indistinguishable at the predetermined viewing distance.

13. The flat panel display device of claim 12, wherein the distance between each of the blue and red pixels in the row and column directions is about 100 µm or less.

14. The flat panel display of claim 2, wherein one of the red and blue pixels is positioned between the neighboring green pixels.

15. The flat panel display of claim 1, wherein each row of pixels and each column of pixels include only red or blue pixels.

16. The flat panel display of claim 1, wherein four adjacent red and blue pixels are arranged in a second substantially diamond shape, the diamond shape does not intersect with a green pixel, and one of the green pixels is positioned at the center of each of the second diamond shapes.

17. The flat panel display of claim 1, wherein each of the blue and red pixels are positioned between horizontal and vertical lines passing through central points of each green pixel adjacent to the oblique direction.

18. The flat panel display of claim 1, wherein the green pixels are arranged such that the green pixels are not vertically adjacent to each other.

19. A flat panel display, comprising:
a plurality of pixels including red, green, and blue pixels arranged in rows and columns,
wherein the red pixels have a first size, the green pixels have a second size and the blue pixels have a third size,
wherein the second size is less than each of the first and third sizes,
wherein four adjacent green pixels are arranged in a substantially diamond shape having one of the red and blue pixels positioned at the center of each diamond shape,
wherein the diamond shape does not intersect with a red pixel and a blue pixel, wherein the green pixels have a length greater than a width, and wherein the length of a first green pixel extends in a row direction toward a first red pixel disposed in a row direction from the first green pixel and the length of a second green pixel extends in a column direction toward a second red pixel disposed in a column direction from the second green pixel.

20. The flat panel display of claim 19, wherein diagonally arranged red pixels are spaced apart at a first distance, wherein diagonally arranged green pixels are spaced apart at a second distance, wherein diagonally arranged blue pixels are spaced apart at a third distance, and wherein the second distance is less than each of the first and third distances.

21. The flat panel display of claim 19, wherein the green pixels are spaced apart in the row and column directions such that at least two adjacent green pixels are indistinguishable from each other at a predetermined viewing distance.

22. The flat panel display of claim 19, wherein the red pixels are arranged in a substantially square shape, wherein the blue pixels are arranged in a substantially square shape, and wherein the green pixels are arranged in a substantially diamond shape.

\* \* \* \* \*